US008503218B2

United States Patent
Kim et al.

(10) Patent No.: US 8,503,218 B2
(45) Date of Patent: Aug. 6, 2013

(54) NONVOLATILE MEMORY DEVICE USING RESISTANCE MATERIAL AND MEMORY SYSTEM INCLUDING THE NONVOLATILE MEMORY DEVICE

(75) Inventors: Jin-Young Kim, Seoul (KR); Ki-Whan Song, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 154 days.

(21) Appl. No.: 13/155,492

(22) Filed: Jun. 8, 2011

(65) Prior Publication Data

US 2011/0305069 A1    Dec. 15, 2011

(30) Foreign Application Priority Data

Jun. 10, 2010    (KR) ........................ 10-2010-0054922

(51) Int. Cl.
*G11C 11/00* (2006.01)
*G11C 5/06* (2006.01)
*G11C 11/06* (2006.01)
*G11C 7/10* (2006.01)

(52) U.S. Cl.
USPC ........... 365/148; 365/55; 365/63; 365/189.04

(58) Field of Classification Search
USPC .................................. 365/51, 63, 148, 189.04
See application file for complete search history.

(56) References Cited

U.S. PATENT DOCUMENTS

| 2005/0237824 A1* | 10/2005 | Umezawa et al. ........ 365/189.11 |
| 2008/0158941 A1* | 7/2008 | Choi et al. .................... 365/163 |
| 2009/0034334 A1 | 2/2009 | Furuyama et al. |
| 2009/0213646 A1* | 8/2009 | Choi et al. .................... 365/163 |
| 2010/0046286 A1* | 2/2010 | Choi ............................. 365/163 |
| 2010/0142249 A1* | 6/2010 | Choi ............................... 365/63 |

FOREIGN PATENT DOCUMENTS

| JP | 2001043688 | 2/2001 |
| KR | 100688553 | 2/2007 |

* cited by examiner

*Primary Examiner* — Ly D Pham
(74) *Attorney, Agent, or Firm* — Volentine & Whitt, PLLC

(57) ABSTRACT

A nonvolatile memory device includes: a memory array including a plurality of memory banks which are arranged in a first direction; a write global bit line and a read global bit line extending in the first direction to be shared by the memory banks; a write circuit connected to the write global bit line and disposed on a first side of the memory array; and a read circuit connected to the read global bit line and disposed on a second side of the memory array opposite the first side of the memory array, wherein each of the memory banks extends in a second direction different from the first direction and comprises a plurality of nonvolatile memory cells, each of the nonvolatile memory cells having a variable resistive element whose resistance value varies according to data stored therein.

12 Claims, 18 Drawing Sheets

NONVOLATILE MEMORY DEVICE USING RESISTANCE MATERIAL AND MEMORY SYSTEM INCLUDING THE NONVOLATILE MEMORY DEVICE

CROSS-REFERENCE TO RELATED APPLICATION(S)

This application claims priority from Korean Patent Application No. 10-2010-0054922 filed on 10 Jun. 2011 in the Korean Intellectual Property Office, the contents of which are incorporated herein by reference in their entirety.

BACKGROUND

The present inventive concept relates to a nonvolatile memory device using a resistance material and a memory system including the nonvolatile memory device Examples of nonvolatile memory devices using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

In particular, a phase-change material of a PRAM cell takes on a crystalline state or an amorphous state as it is cooled after being heated. The phase-change material has low resistance in the crystalline state and has high resistance in the amorphous state. Therefore, the crystalline state may be defined as set data or data 0, and the amorphous state may be defined as reset data or data 1.

SUMMARY

Aspects of the present inventive concept provide a nonvolatile memory device having reduced read while write (RWW) noise.

Aspects of the present inventive concept also provide a memory system including the nonvolatile memory device.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a nonvolatile memory device including: a memory array including a plurality of memory banks which are arranged in a first direction; a write global bit line and a read global bit line extending in the first direction to be shared by the memory banks; a write circuit connected to the write global bit line and disposed on a first side of the memory array; and a read circuit connected to the read global bit line and disposed on a second side of the memory array opposite the first side of the memory array, wherein each of the memory banks extends in a second direction different from the first direction and comprises a plurality of nonvolatile memory cells, each of the nonvolatile memory cells having a variable resistive element whose resistance value varies according to data stored therein.

According to another aspect of the present inventive concept, there is provided nonvolatile memory device including: a memory array comprising a plurality of memory banks which are arranged in a first direction and any one of which comprises a first memory block and a second memory block arranged adjacent to each other in the first direction; a write global bit line and a read global bit line extending in the first direction to be shared by the memory banks; a local bit line extending in the first direction to be shared by the first memory block and the second memory block; and a read local path circuit interposed between the first memory block and the second memory block and connected to the read global bit line and the local bit line, wherein each of the memory banks extend in a second direction different from the first direction and each comprise a plurality of nonvolatile memory cells, each of the nonvolatile memory cells having a variable resistive element whose resistance value varies according to data stored therein.

According to yet another aspect of the present inventive concept, there is provided a memory array comprising a plurality of memory banks which are arranged in a first direction; a write global bit line and a read global bit line extending in the first direction to be shared by the memory banks; a write circuit connected to the write global bit line; and a read circuit connected to the read global bit line, wherein each of the memory banks extends in a second direction different from the first direction and comprises a plurality of nonvolatile memory cells, each of the nonvolatile memory cells having a variable resistive element whose resistance value varies according to data stored therein, and wherein the write circuit is formed on a substrate of a first conductivity type, and a deep well of a second conductivity type is formed under at least part of the write circuit.

According to still another aspect of the present inventive concept, there is provided a device, including: an array of nonvolatile memory cells organized into a plurality of memory banks that are arranged next to each other in a first direction; and a write global bit line and a read global bit line extending in the first direction and configured to be shared by the memory banks. Each of the memory banks includes: a first set of nonvolatile memory cells of a first memory block and a second set of nonvolatile memory cells of a second memory block, wherein the nonvolatile memory cells of each of the first and second memory blocks are arranged next to each other in a second direction perpendicular to the first direction, and wherein each of the nonvolatile memory cells includes a variable resistive element whose resistance value varies according to data stored therein; a read local path circuit to the read global bit line and a local bit line; and a write local path circuit connected to the write global bit line and the local bit line. The read local path circuit is separated from the write local path circuit by the nonvolatile memory cells of at least one of the memory blocks in the memory bank.

According to a further aspect of the present inventive concept, there is provided a memory system including any one of the nonvolatile memory devices.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
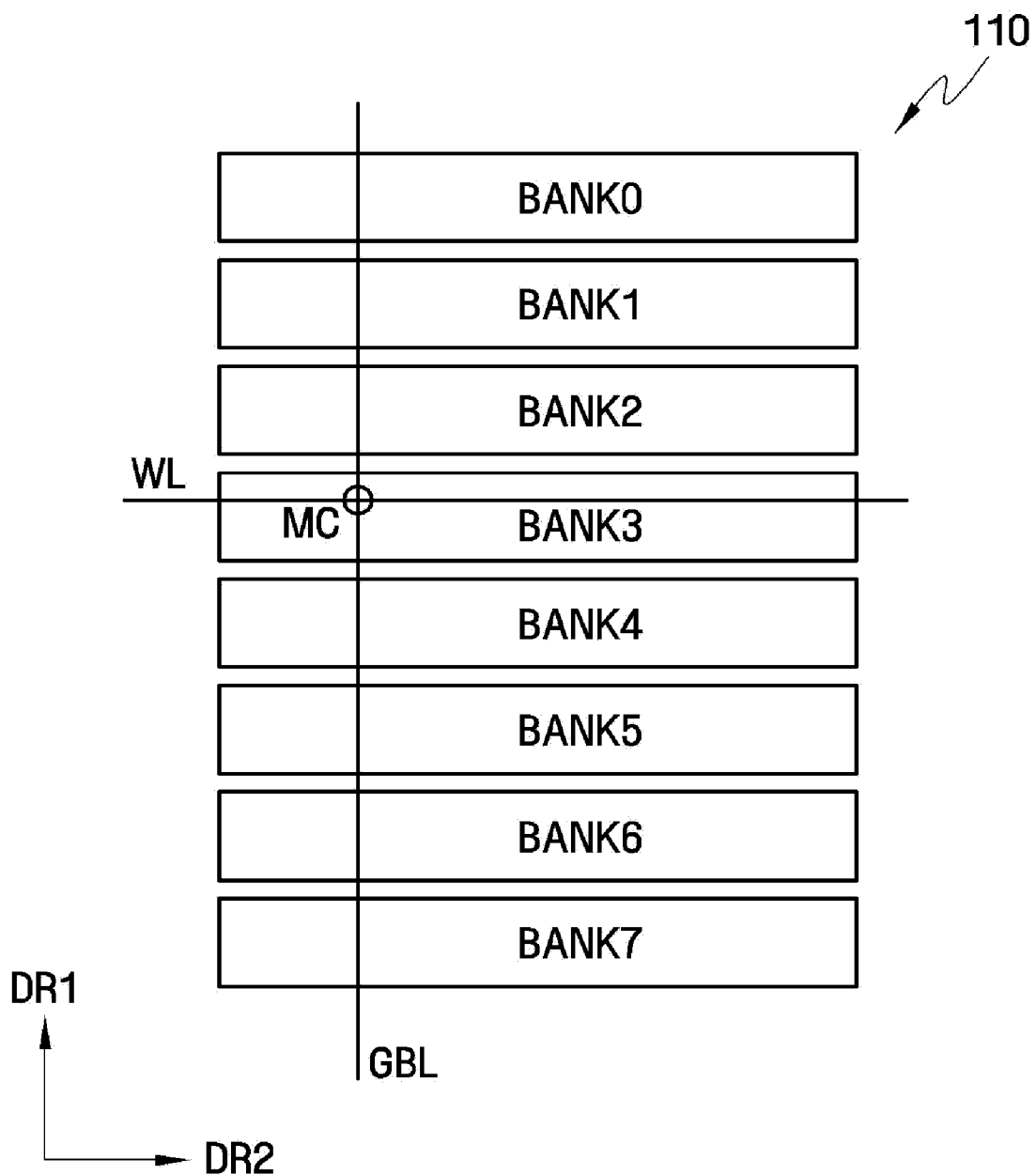
FIG. 1 is a block diagram of a memory array used in nonvolatile memory devices according to exemplary embodiments of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

It will be understood that, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present inventive concept.

The terminology used herein is for the purpose of describing particular embodiments only and is not intended to be limiting of the inventive concept. As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Hereinafter, exemplary embodiments of the present inventive concept will be described using a phase-change random access memory (PRAM). However, it would be apparent to those of ordinary skill in the art to which the present inventive concept pertains that the present inventive concept can be applied to other nonvolatile memory devices using resistance materials, such as resistive RAMs (RRAMs) and ferroelectric RAMs (FRAMs).

FIG. 1 is a block diagram of a memory array 110 used in nonvolatile memory devices according to exemplary embodiments of the present inventive concept.

Referring to FIG. 1, memory array 110 used in the nonvolatile memory devices according to the exemplary embodiments of the present inventive concept includes a plurality of memory banks BANK0 through BANK7. For simplicity, eight memory banks BANK0 through BANK7 are illustrated in FIG. 1. However, the present inventive concept is not limited thereto.

Specifically, the memory banks BANK0 through BANK7 are arranged in a first direction DR1, and each of the memory banks BANK0 through BANK7 extends in a second direction DR2 which is different from the first direction DR1 (e.g., perpendicular to the first direction). When each of the memory banks BANK0 through BANK7 extends in the second direction DR2, it is longer in the second direction DR2 than in the first direction DR1.

As shown in FIG. 1, the first direction DR1 may be parallel to a direction in which a global bit line (GBL) extends, and the second direction DR2 may be parallel to a direction in which a word line (WL) extends.

Each of the memory banks BANK0 through BANK7 includes a plurality of nonvolatile memory cells (MC), each having a variable resistive element whose resistance value varies according to data stored therein. This will be described in detail later with reference to FIG. 4.

Figure 2:
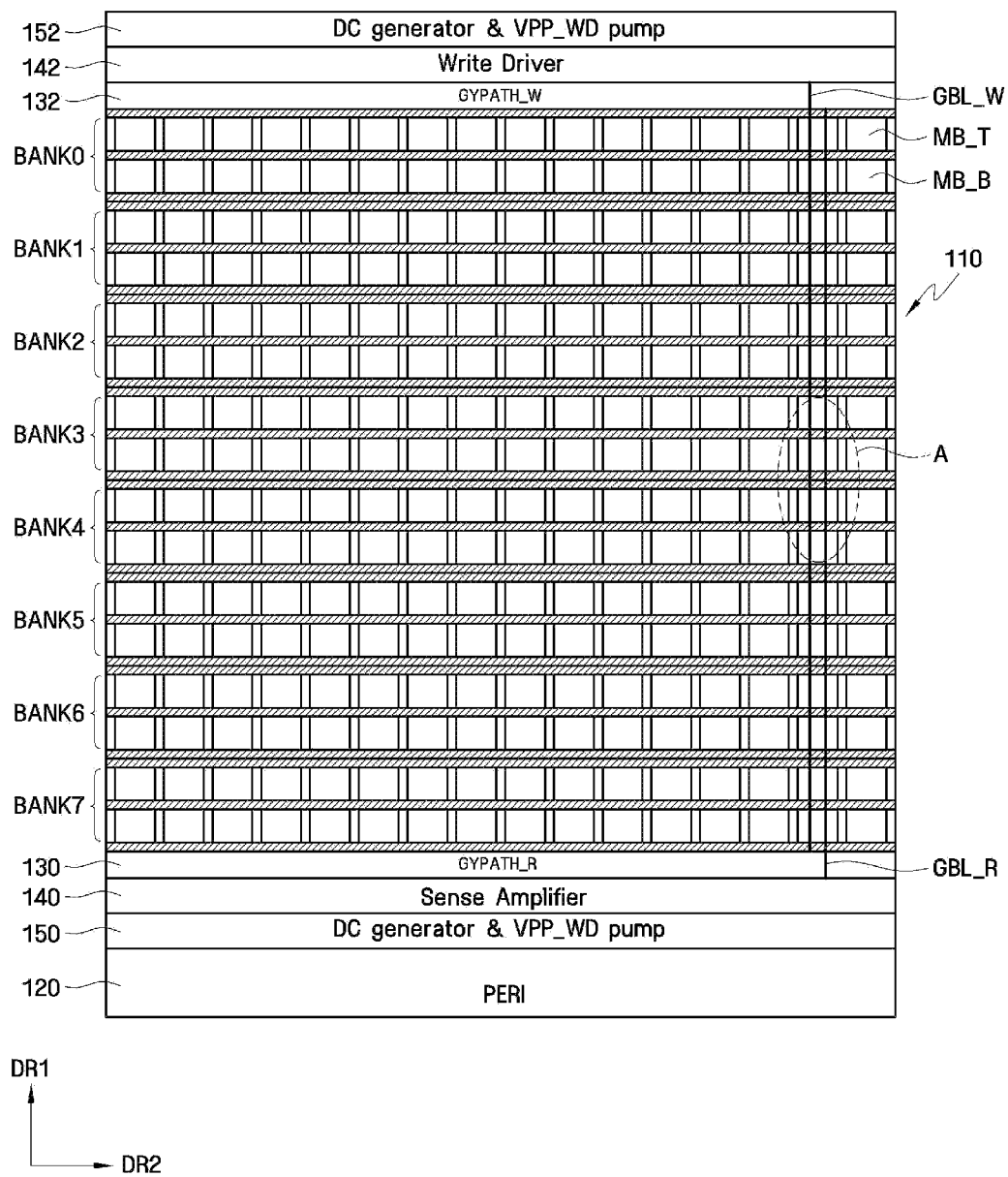
FIG. 2 is a block diagram of a nonvolatile memory device according to an exemplary embodiment of the present inventive concept.
Figure 3:
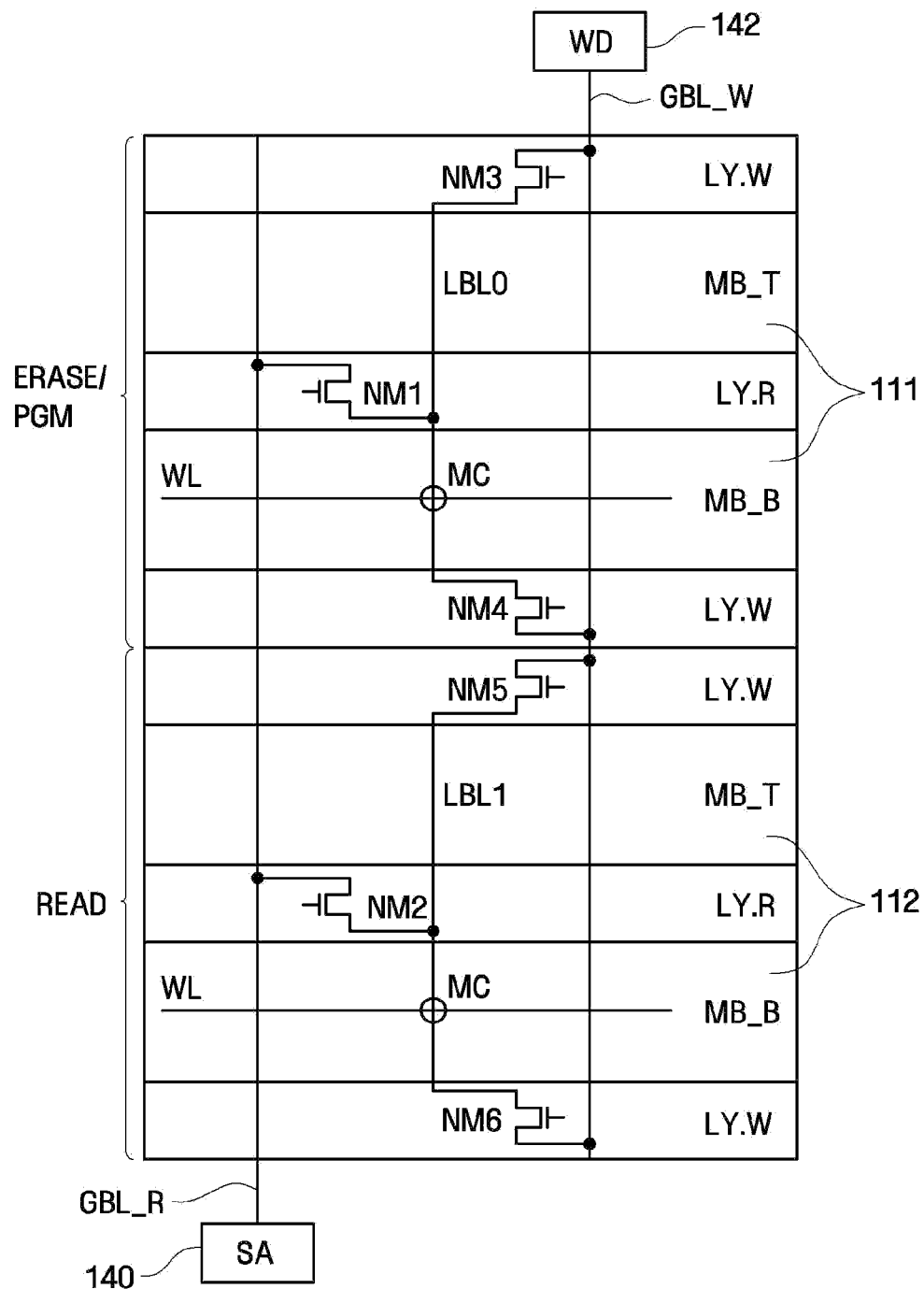
FIG. 3 is a circuit diagram illustrating a region 'A' of FIG. 2 in detail.
Figure 4:
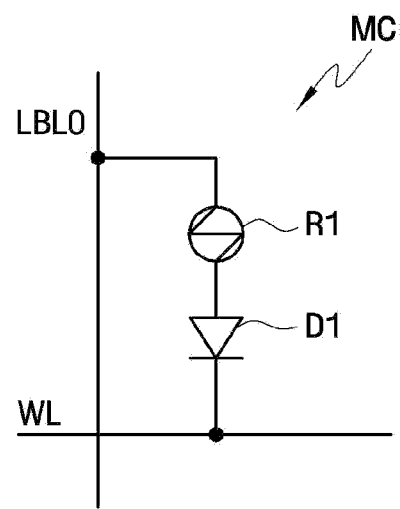
FIG. 4 is a circuit diagram of a memory cell shown in FIG. 3.
Figure 5:
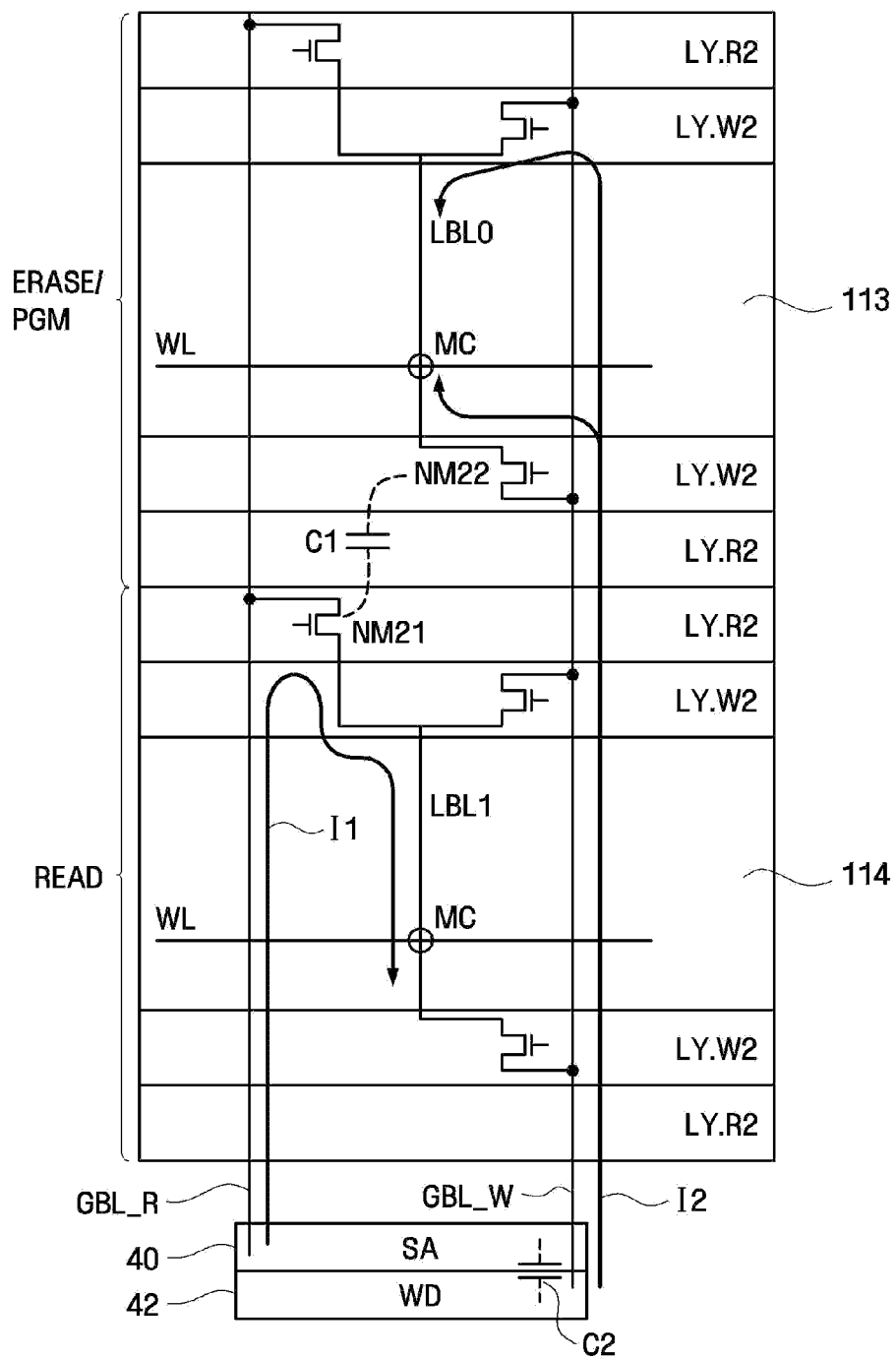
FIGS. 5 through 7 are diagrams for explaining the effects of "noise power" and how these effects may be addressed by a nonvolatile memory device according to an exemplary embodiment of the present inventive concept.
Figure 6:
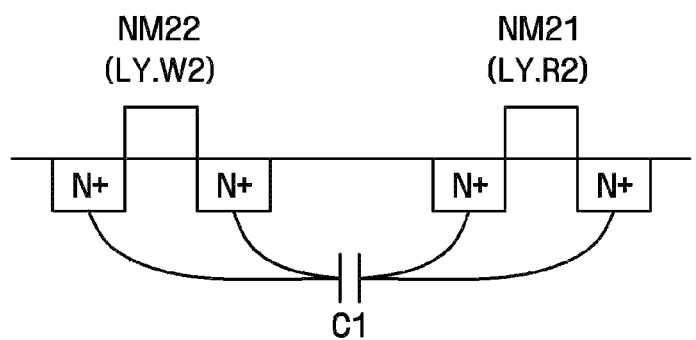
Figure 7:
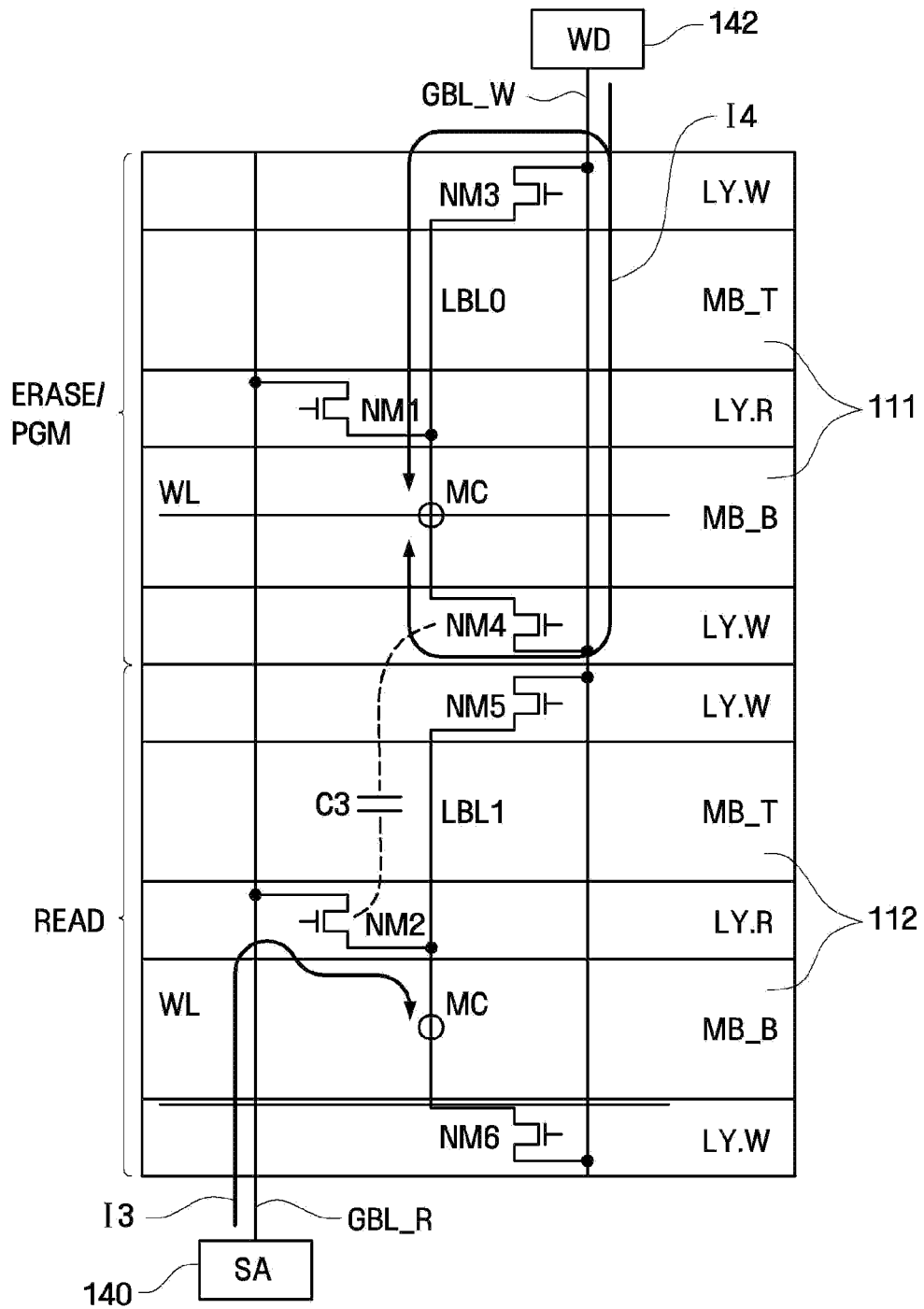

FIG. 2 is a block diagram of a nonvolatile memory device according to an exemplary embodiment of the present inventive concept. FIG. 3 is a circuit diagram illustrating a region 'A' of FIG. 2 in detail. FIG. 4 is a circuit diagram of a memory cell MC shown in FIG. 3. FIGS. 5 through 7 are diagrams for explaining the effects of the nonvolatile memory device according to the exemplary embodiment of the present inventive concept.

Referring to FIGS. 2 and 3, the nonvolatile memory device according to the exemplary embodiment of the present inventive concept includes a plurality of memory banks BANK0 through BANK7, a peripheral circuit 120, a write circuit (132, 142 and 152), and a read circuit (130, 140 and 150).

As described above, the memory banks BANK0 through BANK7 are arranged in a first direction DR1, and each of the memory banks BANK0 through BANK7 extends in a second direction DR2 which is different from the first direction DR1 (e.g., perpendicular to the first direction). As shown in the drawings, any one of the memory banks BANK0 through BANK7 may include a first memory block MB_T and a second memory block MB_B. The first and second memory blocks MB_T and MB_B may be arranged adjacent to each other in the first direction DR1. That is, in the drawings, the first and second memory blocks MB_T and MB_B may be arranged vertically.

Each of the memory banks BANK0 through BANK7 may include a plurality of memory cells MC such as the one shown in FIG. 4. As shown in FIG. 4, each of the memory cells MC includes a variable resistive element R1 having a different resistance value according to data stored therein and an access element D1 controlling a current that flows through the variable resistive element R1. The variable resistive element R1 may be formed of various kinds of materials, such as GaSb, InSb, InSe, Sb2Te3, and GeTe in which two elements are chemically combined with each other, GeSbTe, GaSeTe, InSbTe, SnSb2Te4, and InSbGe in which three elements are chemically combined with one another, and AgInSbTe, (GeSn)SbTe, GeSb(SeTe), and Te81Ge15Sb2S2 in which four elements are chemically combined with one another. Among them, GeSbTe that contains germanium (Ge), antimony (Sb), and tellurium (Te) may be typically used for the variable resistive element R1. The access element D1 may be a diode as shown in FIG. 4. However, the present inventive concept is not limited thereto. Examples of the access element D1 include, but are not limited to, a field-effect transistor (FET), an NPN bipolar transistor, and a PNP bipolar transistor.

Referring back to FIGS. 2 and 3, a write global bit line GBL_W and a read global bit line GBL_R extend in the first direction DR1 to be shared by the memory cells MC.

The write circuit (132, 142 and 152) may be connected to the write global bit line GBL_W and may be disposed on a first side of memory array 110 (for example, above memory array 110 in the drawings).

The read circuit (130, 140 and 150) may be connected to the read global bit line GBL_R and may be disposed on a second side of memory array 110 (for example, below memory array 110 in the drawings).

In FIG. 2, the write circuit (132, 142 and 152) is disposed above memory array 110, and the read circuit (130, 140 and 150) is disposed below memory array 110. However, the present inventive concept is not limited thereto. For example, the write circuit (132, 142 and 152) may be disposed on the left side of memory array 110, and the read circuit (130, 140 and 150) may be disposed on the right side of the memory array 110.

The write circuit (132, 142 and 152) may include a write global path circuit 132, a write driver 142, and a first voltage generator 152.

First voltage generator 152 may generate a first voltage used in a write operation. The first voltage may be, but is not limited to, a set voltage Vset used to write set data, a reset voltage Vreset used to write reset data, or a step-up voltage VPP_WD.

Write driver 142 generates a write current using the first voltage and provides the generated write current to a selected memory cell MC via the write global bit line GBL_W.

Write global path circuit 132 may be in the form of, e.g., a transfer gate.

The read circuit (130, 140 and 150) may include a read global path circuit 130, a sense amplifier 140, and a second voltage generator 150.

Second voltage generator 150 may generate a second voltage used in a read operation. The second voltage may be, but is not limited to, a pre-charge voltage Vpre, a reference voltage Vref, a clamping voltage Vclamp, or a step-up voltage VPP_RD.

Sense amplifier 140 generates a read current using the second voltage and provides the generated read current to a selected memory cell MC via the read global bit line GBL_R.

Read global path circuit 130 may include, but is not limited to, an n-channel metal oxide semiconductor (NMOS).

As shown in FIG. 3, local bit lines LBL0 and LBL1 extend in the first direction DR1 to be shared by the first and second memory blocks MB_T and MB_B.

The read global bit line GBL_R may be connected to each of the local bit lines LBL0 and LBL1 by a read local path circuit LY.R. The read local path circuit LY.R may be located between the first memory block MB_T and the second memory block MB_B of a memory bank. If the nonvolatile memory device is formed on a substrate of a first conductivity type (e.g., a P type), the read local path circuit LY.R may include a transistor NM1 or NM2 of a second conductivity type (e.g., an N type).

The write global bit line GBL_W may be connected to each of the local bit lines LBL0 and LBL1 by a write local path circuit LY.W. The write local path circuit LY.W may be disposed opposite the read local path circuit LY.R with respect to the first memory block MB_T of a memory bank (that is, disposed above the first memory block MB_T in FIG. 3) and/or may be disposed opposite the read local path circuit LY.R with respect to the second memory block MB_B (that is, disposed below the second memory block MB_B in FIG. 3). If the nonvolatile memory device is formed on a substrate of the first conductivity type (e.g., the P type), the write local path circuit LY.W may include a transistor NM3, NM4, NM5 or NM6 of the second conductivity type (e.g., the N type).

Referring to FIG. 3, the nonvolatile memory device according to the exemplary embodiment of the present inventive concept may perform a read while write (RWW) operation.

Specifically, while any one of the memory banks BANK1 through BANK7 (e.g., element 111 illustrated in an upper part of FIG. 3) performs a write operation PGM or an erase operation ERASE, another one of the memory banks BANK1 through BANK7 (e.g., element 112 illustrated in a lower part of FIG. 3) may perform a read operation READ.

In general, during a RWW operation, it may be possible that the write operation PGM may affect the read operation READ, causing the read operation READ to fail. In particular, a voltage (e.g., a reset voltage) used in the write operation PGM may be significantly higher than a voltage used in the read operation READ. As a result, when a memory cell MC being written to is located close to a memory cell MC being read, the voltage used in the write operation PGM may affect the memory cell MC being read. This effect will hereinafter be referred to as "power noise."

The deleterious effect of power noise will now be described with reference to an example of a nonvolatile memory device as illustrated in FIGS. 5 and 6.

Referring to FIG. 5, a write local path circuit LY.W2 and a read local path circuit LY.R2 are disposed above and below a memory block 113. Likewise, the write local path circuit LY.W2 and the read local path circuit LY.R2 are disposed above and below a memory block 114. Furthermore, a sense amplifier 40 and a write driver 42 are arranged adjacent to each other.

In a case where the write operation PGM or the erase operation ERASE is performed on memory block 113 while the read operation READ is performed on memory block 114, a read current I1 is supplied from the sense amplifier 40 to a memory cell MC via a read global bit line GBL_R and an NMOS transistor NM21 of the read local path circuit LY.R2.

Also, a write current I2 is supplied from write driver 42 to a memory cell MC via a write global bit line GBL_W and an NMOS transistor NM22 of the write local path circuit LY.W2.

In this case, since the NMOS transistor NM21 and the NMOS transistor NM22 are located close to each other, the high-level write current I2 passing through the NMOS transistor NM22 may affect the NMOS transistor NM21 through a substrate (i.e., a parasitic capacitor C1). The parasitic capacitor C1 may be formed as shown in FIG. 6.

Furthermore, since sense amplifier 40 and write driver 42 are located very close to each other, a high voltage used in write driver 42 may affect sense amplifier 40 through a parasitic capacitor C2.

To perform the RWW operation without failures, the power noise should be reduced.

Toward this end, a nonvolatile memory device according to an exemplary embodiment of the present inventive concept can reduce or minimize the power noise, as will now be illustrated with reference to FIG. 7 which illustrates a case according to an embodiment of the present inventive concept.

As shown in FIG. 7, in a case where the write operation PGM or the erase operation ERASE is performed on memory block 111 while the read operation READ is performed on memory block 112, a read current I3 is supplied from the sense amplifier 140 to a memory cell MC via the read global bit line GBL_R and the NMOS transistor NM2 of the read local path circuit LY.R. Also, a write current I4 is supplied from write driver 142 to a memory cell MC via the write global bit line GBL_W and an NMOS transistor NM4 of the write local path circuit LY.W.

In this case, since the NMOS transistor NM2 and the NMOS transistor NM4 are located very far from each other, the high-level write current I4 passing through the NMOS transistor NM4 is not likely to affect the NMOS transistor NM2 through the substrate (i.e., via a parasitic capacitor C3).

Furthermore, because sense amplifier 140 and write driver 142 are located very far from each other, a high voltage used in write driver 142 is not likely to affect sense amplifier 140.

Figure 8:
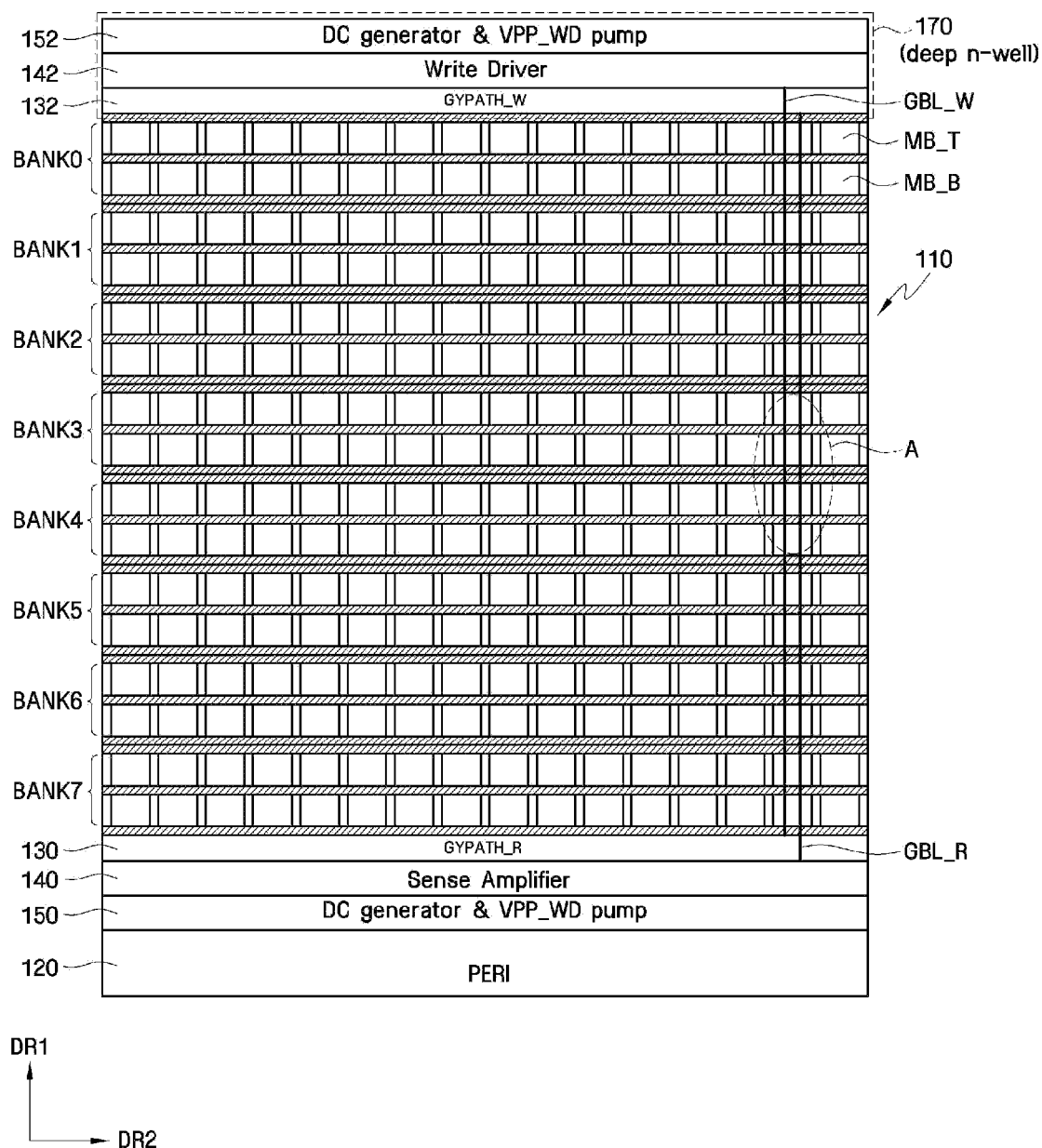
FIG. 8 is a diagram illustrating a nonvolatile memory device according to another exemplary embodiment of the present inventive concept.

FIG. 8 is a diagram illustrating a nonvolatile memory device according to another exemplary embodiment of the present inventive concept. For simplicity, the following description will focus on the differences between the current and previous exemplary embodiments of the present inventive concept.

Referring to FIG. 8, the nonvolatile memory device is formed on a substrate of a first conductivity type (e.g., a P type). Here, a deep well 170 of a second conductivity type (e.g., an N type) may be formed under at least part of a write circuit (132, 142 and 152).

Figure 9:
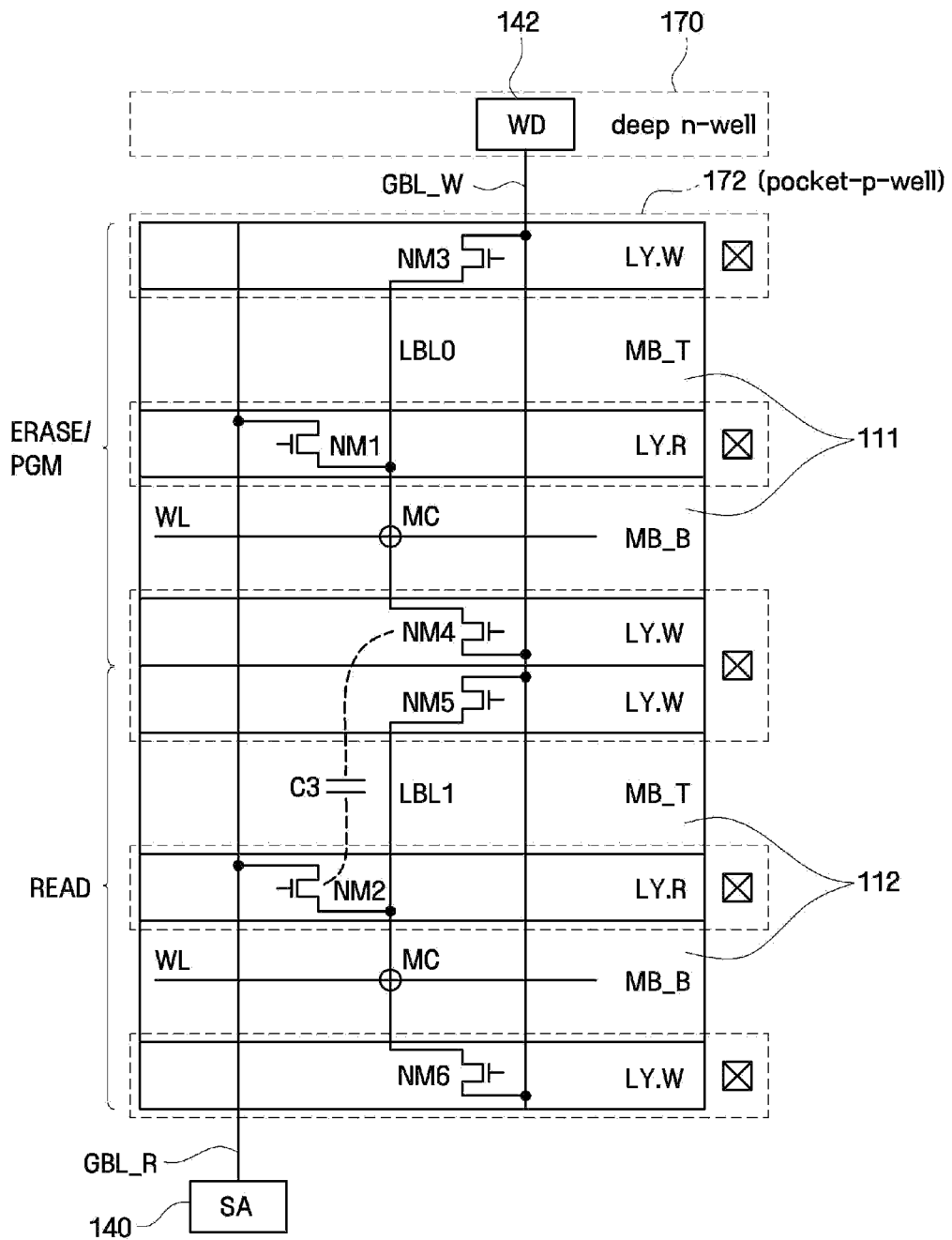
FIG. 9 is a diagram illustrating a nonvolatile memory device according to another exemplary embodiment of the present inventive concept.

FIG. 9 is a diagram illustrating a nonvolatile memory device according to another exemplary embodiment of the present inventive concept. For simplicity, the following description will focus on the differences between the current and previous exemplary embodiments of the present inventive concept.

Referring to FIG. 9, the nonvolatile memory device is formed on a substrate of a first conductivity type (e.g., a P type), and any one of a write local path circuit LY.W and a read local path circuit LY.R may include a transistor NM1, NM2, NM3, NM4, NM5 or NM6 of a second conductivity type (e.g., an N type). Each of the transistors NM1 through NM6 may be formed within a pocket well 172 of the first conductivity type (e.g., the P type).

Figure 10:
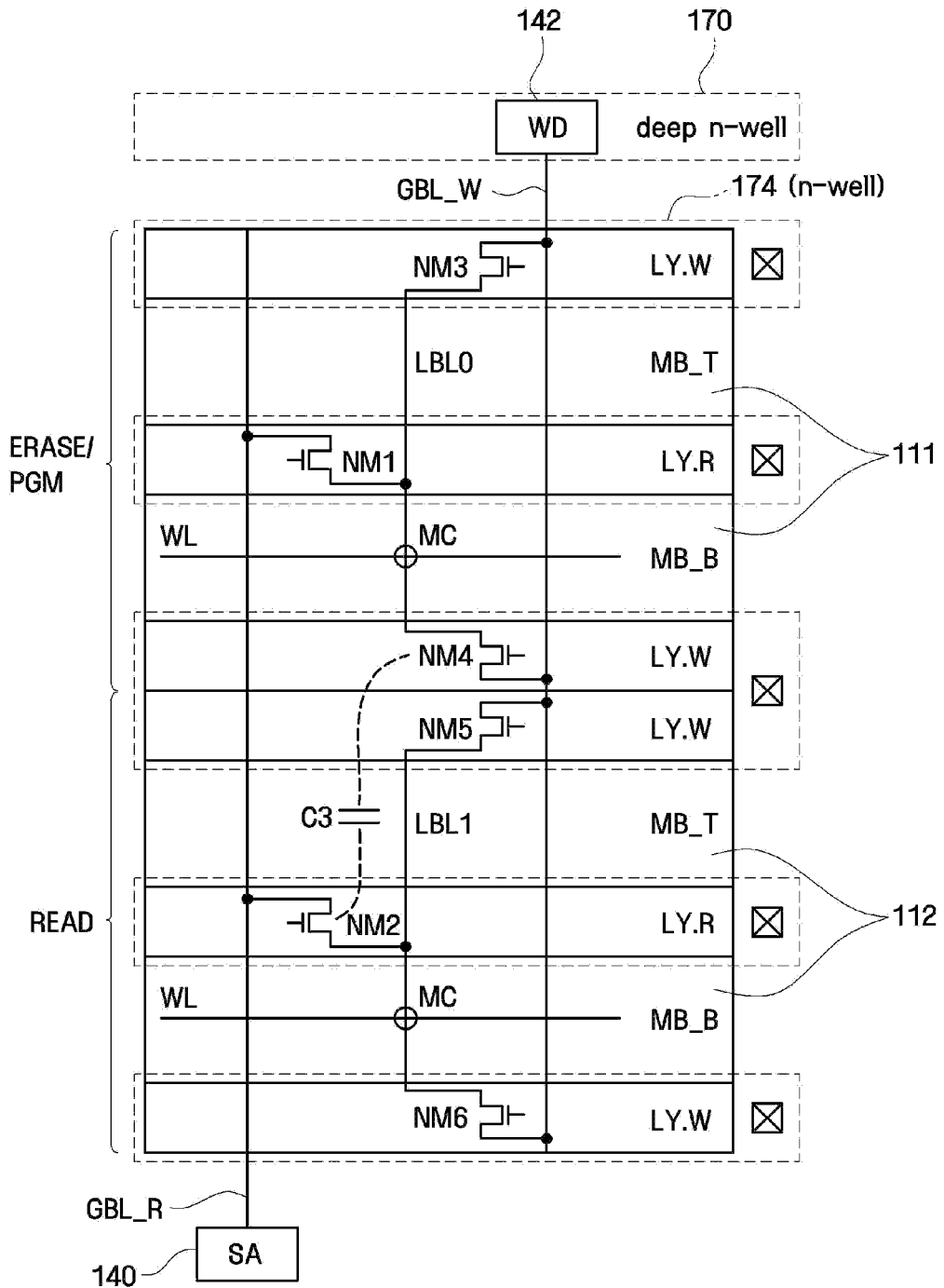
FIG. 10 is a diagram illustrating a nonvolatile memory device according to another exemplary embodiment of the present inventive concept.

FIG. 10 is a diagram illustrating a nonvolatile memory device according to another exemplary embodiment of the present inventive concept. For simplicity, the following description will focus on the differences between the current and previous exemplary embodiments of the present inventive concept.

Referring to FIG. 10, the nonvolatile memory device is formed on a substrate of a first conductivity type (e.g., a P type), and any one of a write local path circuit LY.W and a read local path circuit LY.R may include a transistor NM1, NM2, NM3, NM4, NM5 or NM6 of the first conductivity type (e.g., the P type). Each of the transistors NM1 through NM6 may be formed within a well 174 of a second conductivity type (e.g., an N type).

FIGS. 11 through 15 are diagrams illustrating memory systems according to first through fifth exemplary embodiments of the present inventive concept. Specifically, FIGS. 11 through 15 illustrate memory systems using nonvolatile memory devices according to exemplary embodiments of the present inventive concept, such as the exemplary embodiments described above.

Figure 11:
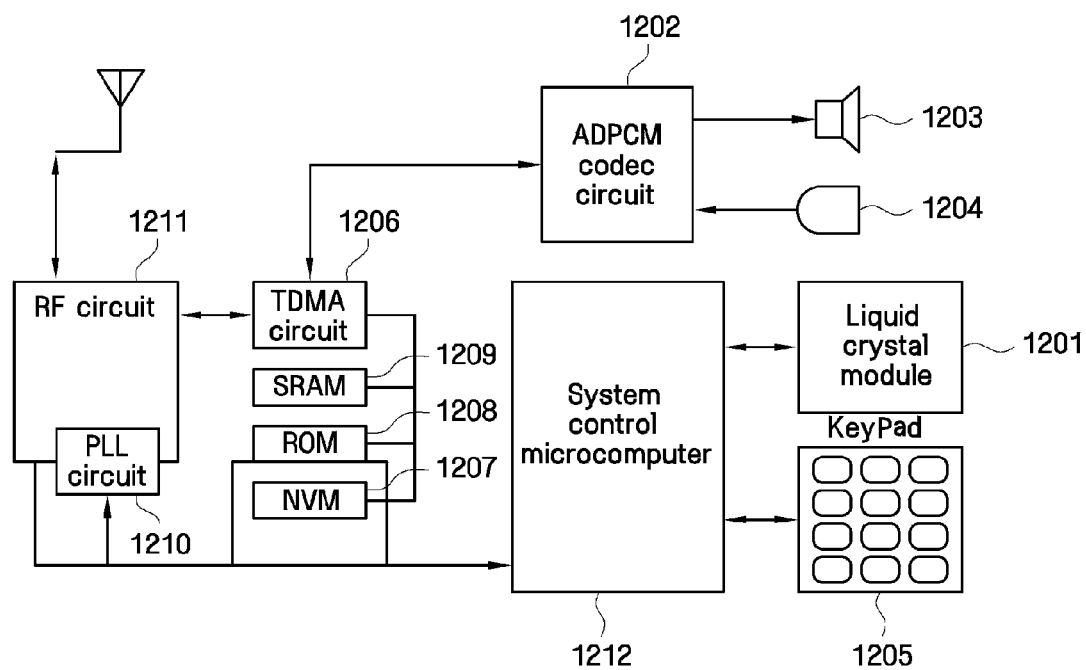
FIGS. 11 through 23 are diagrams illustrating memory systems including nonvolatile memory devices according to exemplary embodiments of the present inventive concept.

FIG. 11 is a diagram illustrating a cellular phone system which uses nonvolatile memory devices according to exemplary embodiments of the present inventive concept.

Referring to FIG. 11, the cellular phone system includes a liquid crystal module 1201, an adaptive differential pulse code modulation (ADPCM) codec circuit 1202 which compresses sound and/or decompresses compressed sound, a speaker 1203, a microphone 1204, a keypad 1205, a time division multiple access (TDMA) circuit 1206 which time-division multiplexes digital data, a phase-locked loop (PLL) circuit 1210 which sets a carrier frequency of a wireless signal, and a radio frequency (RF) circuit 1211 which transmits or receives a wireless signal.

In addition, the cellular phone system may include various types of memory devices. For example, the cellular phone system may include a nonvolatile memory device 1207, a read only memory (ROM) 1208, and a static random access memory (SRAM) 1209. Nonvolatile memory device 1207 may be any nonvolatile memory device according the present inventive concept such as the exemplary embodiments described above, and may store, for example, an identification (ID) number. ROM 1208 may store programs, and SRAM 1209 may serve as a work area for a system control microcomputer 1212 or temporarily store data. System control microcomputer 1212 is a processor and may control the write operation and read operation of nonvolatile memory device 1207.

Figure 12:
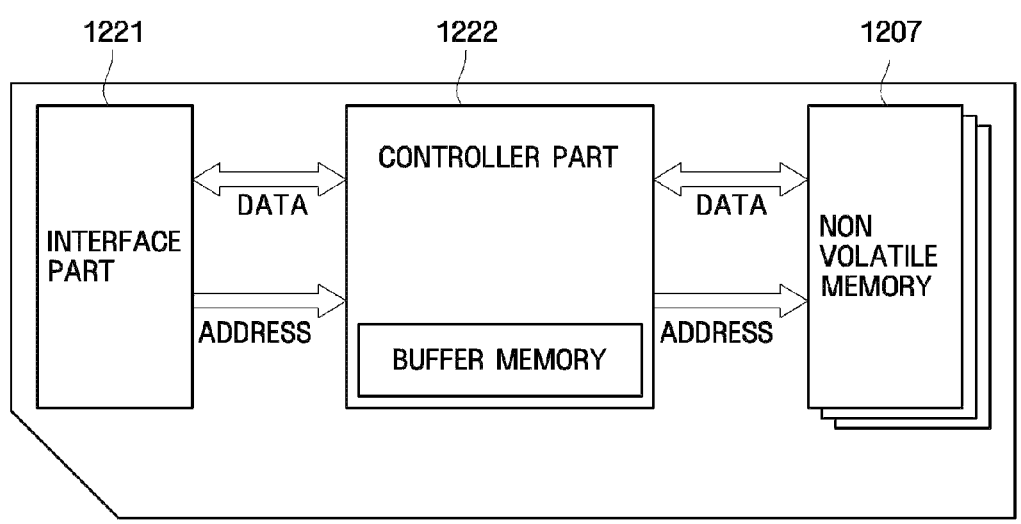

FIG. 12 is a diagram illustrating a memory card which uses nonvolatile memory devices according to exemplary embodiments of the present inventive concept. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 12, the memory card may include an interface part 1221 which interfaces with an external device, a controller part 1222 which includes a buffer memory and controls the operation of the memory card, and one or more nonvolatile memory devices 1207 according to exemplary embodiments of the present inventive concept. Controller part 1222 is a processor and may control the write and read operations of the nonvolatile memory devices 1207. Specifically, controller part 1222 is coupled to interface part 1221 and each of the nonvolatile memory devices 1207 by a data bus DATA and an address bus ADDRESS.

Figure 13:
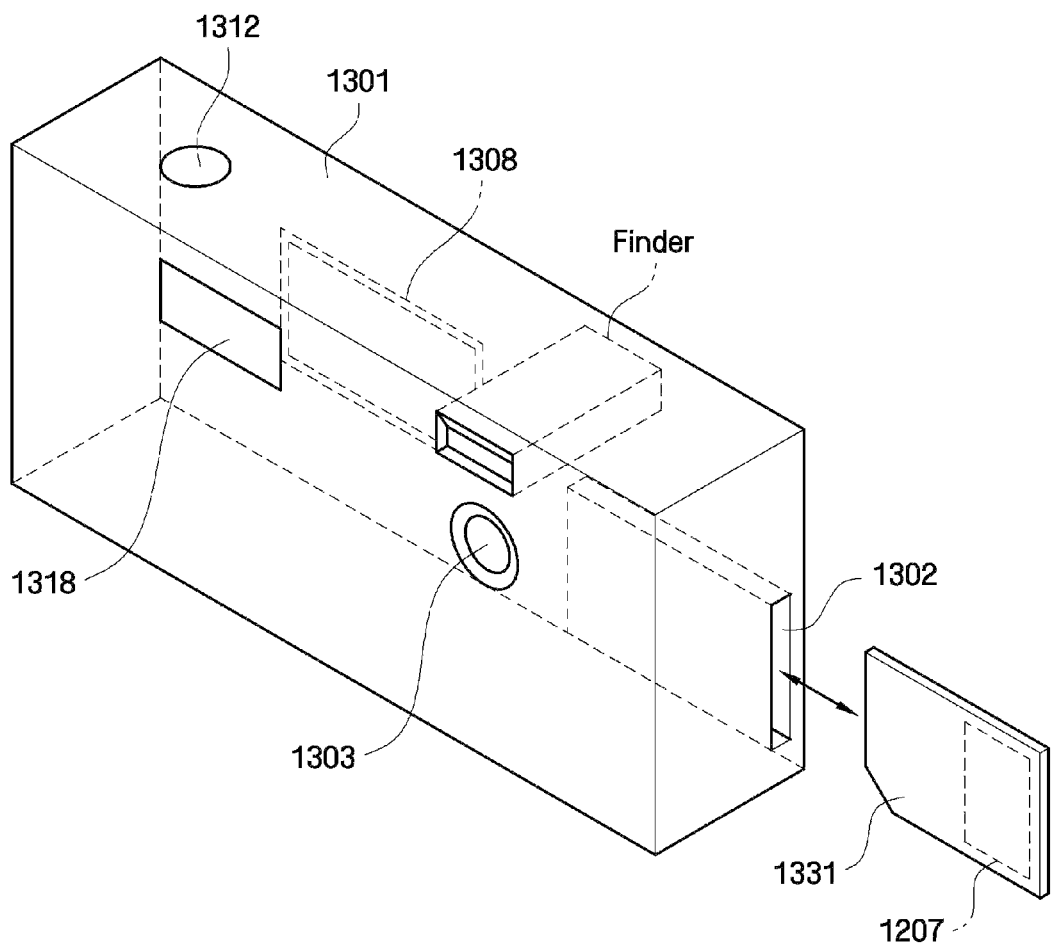

FIG. 13 is a diagram illustrating a digital still camera which uses nonvolatile memory devices according to exemplary embodiments of the present inventive concept.

Referring to FIG. 13, the digital still camera includes a body 1301, a slot 1302, a lens 1303, a display 1308, a shutter button 1312, and a strobe 1318. In particular, a memory card 1331 may be inserted into slot 1308 and include one or more nonvolatile memory devices 1207 according to exemplary embodiments of the present inventive concept.

If memory card 1331 is of a contact type, it electrically contacts a specified electrical circuit on a circuit board when it is inserted into slot 1302. If memory card 1331 is of a non-contact type, it communicates with memory card 1331 using a wireless signal.

Figure 14:
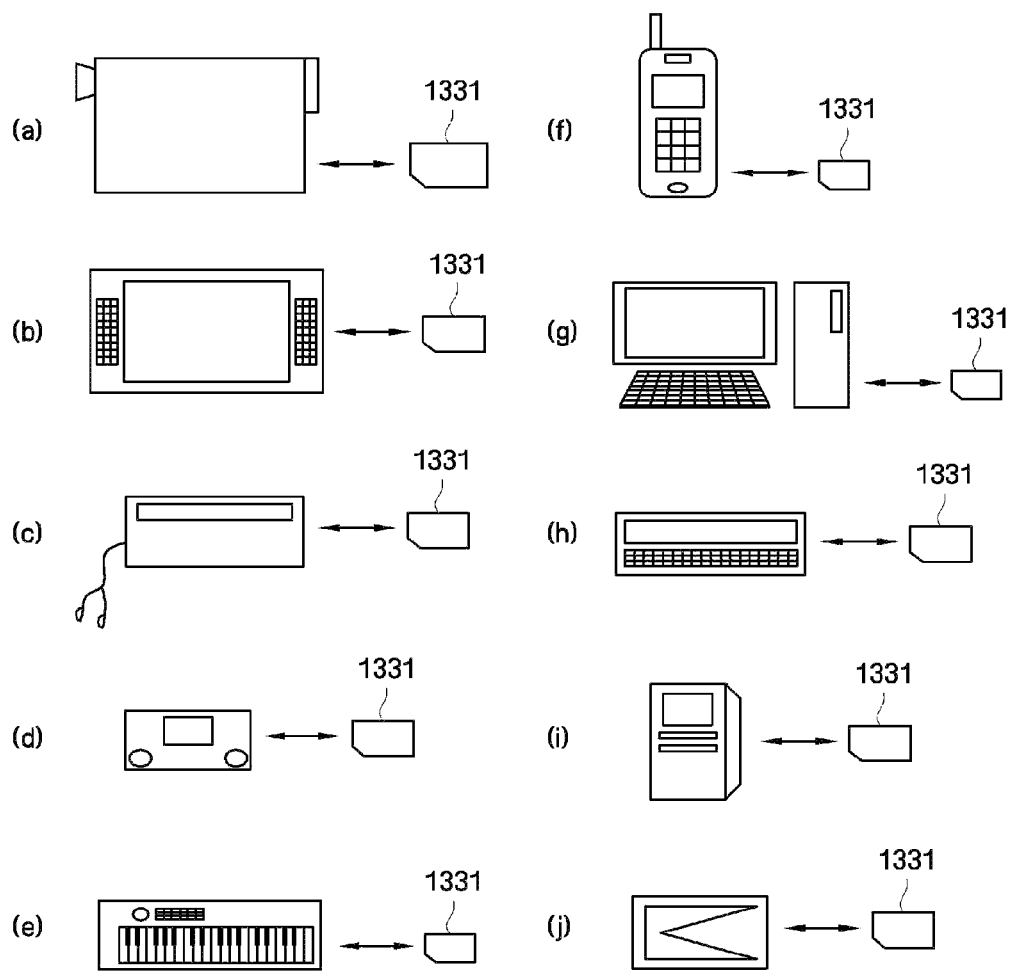

FIG. 14 is a diagram illustrating various systems which use the memory card of FIG. 12.

Referring to FIG. 14, a memory card 1331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 15:
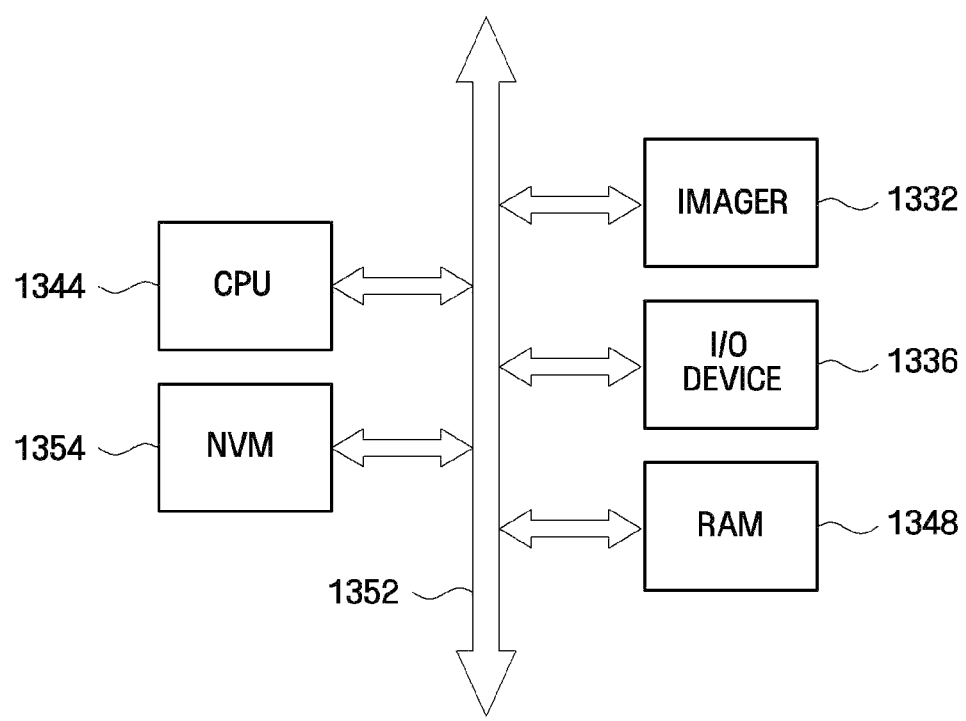

FIG. 15 is a diagram illustrating an image sensor system which uses nonvolatile memory devices according to exemplary embodiments of the present inventive concept.

Referring to FIG. 15, the image sensor system may include an imager 1332, an input/output device 1336, a random access memory (RAM) 1348, a central processing unit (CPU) 1344, and a nonvolatile memory device 1354 according to exemplary embodiments of the present inventive concept. These components, i.e., imager 1332, input/output device 1336, RAM 1348, CPU 1344, and nonvolatile memory device 1354 communicate with each other using a bus 1352. Imager 1332 may include a photo sensing element such as a photogate or a photodiode. Each of the above components and a processor may be implemented as a single chip or separate chips.

Figure 16:
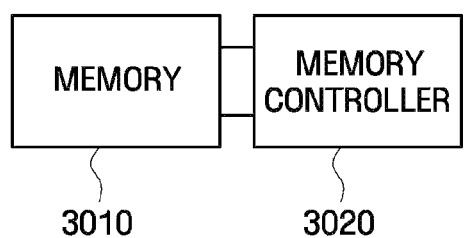

FIG. 16 is a block diagram of an exemplary memory system which uses nonvolatile memory devices according to exemplary embodiments of the present inventive concept.

Referring to FIG. 16, a memory 3010 is coupled to a memory controller 3020. Memory 3010 may be any of the nonvolatile memory device embodiments described above. Memory controller 3020 supplies input signals for controlling operation of memory 3010. For example, memory controller 3020 supplies a command CMD and address signals. Memory controller 3020 may include a memory interface, a host interface, an error correction code (ECC) circuit, a CPU, and a buffer memory. The memory interface provides data transmitted from the buffer memory to memory 3010 or transmits data read out of memory 3010 to the buffer memory. Also, the memory interface may provide a command or an address transmitted from an external host to memory 3010.

The host interface may communicate with an external host through a universal serial bus (USB), small computer system interface (SCSI), peripheral component interconnect (PCI) express, AT attachment (ATA), parallel ATA (PATA), serial ATA (SATA), or serial attached SCSI (SAS) interface, for example.

A memory system according to embodiments of the present inventive concept may include an ECC circuit, which generates a parity bit using data transmitted to memory 3010. The generated parity bit may be stored in a specific area of memory 3010, together with data. The ECC circuit detects an error of data read out of memory 3010. If the detected error is within a correction range, the ECC circuit corrects the detected error.

The CPU controls the external host or memory 3010 through the host interface or the memory interface. The CPU may control write, read, and erase operations depending on firmware for driving a memory.

The buffer memory temporarily stores write data provided from the external host or data read out of memory 3010. Also the buffer memory may store meta data or cache data to be stored in memory 3010. During a sudden power-off operation, meta data or cache data stored in the buffer memory may be stored in memory 3010. The buffer memory may be a dynamic random access memory (DRAM) and an SRAM.

Figure 17:
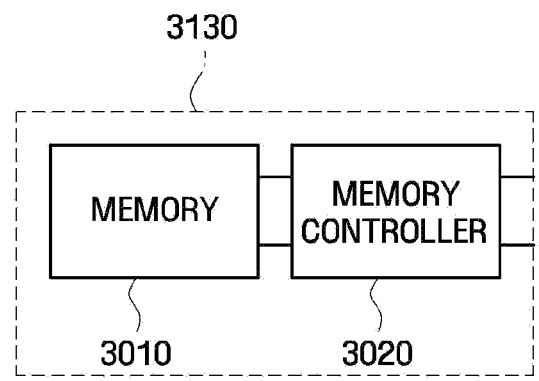

FIG. 17 is a block diagram of another exemplary memory system which uses nonvolatile memory devices according to exemplary embodiments of the present inventive concept. This memory system is the same as the memory system of FIG. 16, except that a memory 3010 and a memory controller 3020 are embedded in a card 3130. For example, card 3130 may be a flash memory card. Namely, card 3130 may be a card meeting any industry standard for use with a consumer electronics device such as a digital camera, personal computer, etc. It will be appreciated that memory controller 3020 may control memory 3010 based on controls signals received by card 3130 from another (e.g., external) device.

Figure 18:
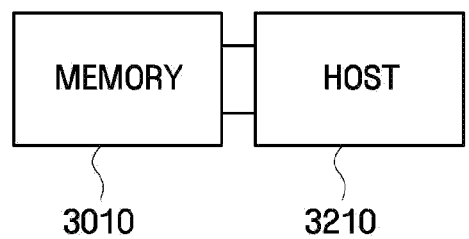

FIG. 18 is a block diagram of another exemplary memory system which uses nonvolatile memory devices according to exemplary embodiments of the present inventive concept. Referring to FIG. 18, a memory 3010 may be coupled to a host system 3210. Host system 3210 may be a processing system such as a personal computer, digital camera, etc. Host system 3210 may use memory 3010 as an erasable storage medium. As described above, host system 3210 supplies input signals for controlling operation of memory 3010. For example, host system 3210 supplies a command CMD and address signals.

Figure 19:
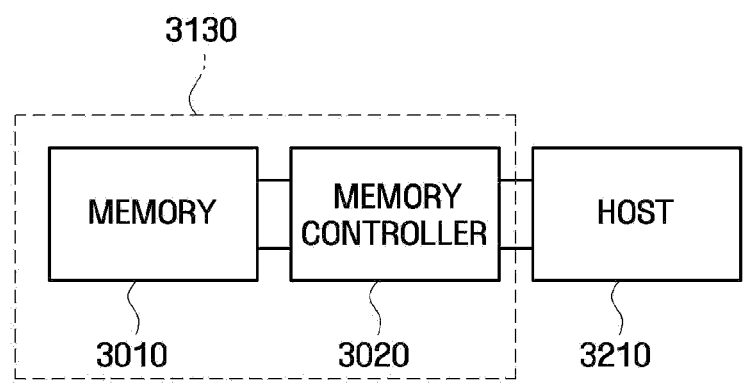

FIG. 19 is a block diagram of another exemplary memory system which uses nonvolatile memory devices according to exemplary embodiments of the present inventive concept. Referring to FIG. 19, a host system 3210 is coupled to a card 3130. In this embodiment, host system 3210 transmits control signals to card 3130 such that memory controller 3020 controls operation of a memory 3010.

Figure 20:
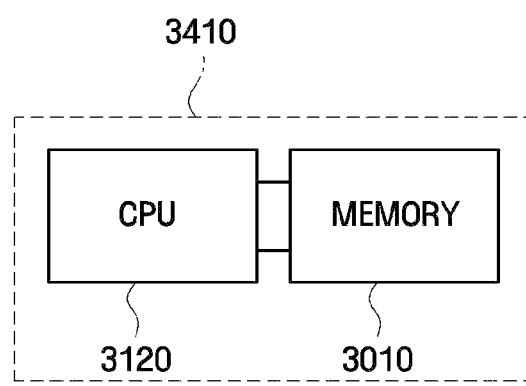

FIG. 20 is a block diagram of another exemplary memory system which uses nonvolatile memory devices according to exemplary embodiments of the present inventive concept. Referring to FIG. 20, a memory 3010 is connected to a CPU 3120 within a computer system 3410. For example, computer system 3410 may be a personal computer, PDA, etc. Memory 3010 may be directly connected with CPU 3120, or connected via a bus, etc.

A nonvolatile memory device according to exemplary embodiments of the present inventive concept may be used as a storage class memory (SCM), which is the general concept of memories capable of simultaneously providing nonvolatile characteristics and access characteristics. The SCM may be utilized as not only a data storage space but also a program performing space.

The above-described PRAM, RRAM, FRAM, and magnetic RAM (MRAM) may be appropriate examples of an SCM. Such an SCM may be used as not only a data storage memory instead of a flash memory but also a main memory instead of an SRAM. Moreover, one SCM may be used instead of a flash memory and an SRAM.

Figure 21:
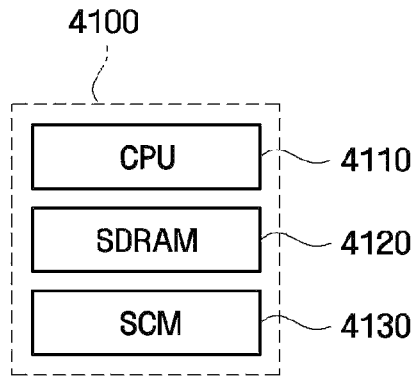

FIG. 21 is a block diagram of a memory system 4100 which uses an SCM. Referring to FIG. 21, memory system 4100 includes a CPU 4110, a synchronous DRAM (SDRAM) 4120, and an SCM 4130 used instead of a flash memory.

In memory system 4100, data access speed of SCM 4130 may be greater than that of a flash memory. For example, under a PC environment where CPU 4110 runs at 4 GHz, data access speed of a PRAM which is a kind of SCM 4130 may be about 32 times greater than that of a flash memory. Thus, memory system 4100 equipped with SCM 4130 may attain higher-speed access gain than a memory system equipped with a flash memory.

Figure 22:
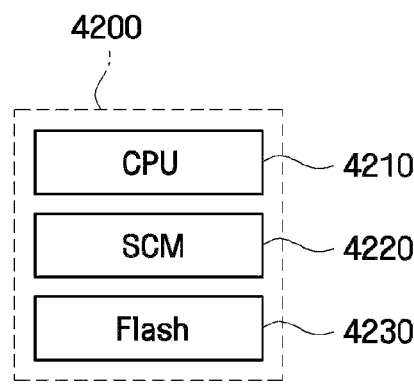

FIG. 22 is a block diagram of another exemplary memory system 4200 which uses an SCM. Referring to FIG. 22, memory system 4200 includes a CPU 4210, an SCM 4220 used instead of an SDRAM, and a flash memory 4230.

In memory system 4200, power dissipation of SCM 4220 is less than that of an SDRAM. Energy dissipated by the main memory of a computer system may amount to about 40 percent of total energy. Therefore, many efforts have been intensively made to reduce power dissipation of the main memory. An SCM may reduce dynamic energy dissipation by an average of as much as about 53 percent and reduce energy dissipation caused by power leakage by an average of as much as about 73 percent. As a result, memory system 4200 equipped with SCM 4220 may allow power dissipation to be reduced compared to a memory system equipped with an SDRAM.

Figure 23:
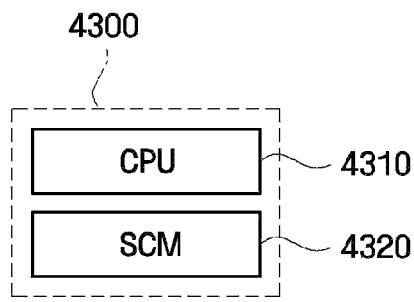

FIG. 23 is a block diagram of another exemplary memory system 4300 which uses an SCM. Referring to FIG. 23, memory system 4300 includes a CPU 4310 and an SCM 4320. SCM 4320 is used as a main memory instated of an SDRAM and as a data storage memory instead of a flash memory. Memory system 4300 is advantageous in data access speed, low power, space utilization, and cost.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A nonvolatile memory device comprising:
a memory array including a plurality of memory banks which are arranged in a first direction;
a write global bit line and a read global bit line extending in the first direction to be shared by the memory banks;
a write circuit connected to the write global bit line and disposed on a first side of the memory array; and
a read circuit connected to the read global bit line and disposed on a second side of the memory array opposite the first side of the memory array,
wherein each of the memory banks extends in a second direction different from the first direction and comprises a plurality of nonvolatile memory cells, each of the nonvolatile memory cells having a variable resistive element whose resistance value varies according to data stored therein,
wherein any one of the memory banks comprises a first memory block and a second memory block, and further comprising:
a local bit line extending in the first direction to be shared by the first memory block and the second memory block; and
a read local path circuit interposed between the first memory block and the second memory block and connected to the read global bit line and the local bit line.

2. The nonvolatile memory device of claim 1, further comprising a write local path circuit located opposite the read local path circuit with respect to at least one of the first memory block and the second memory block and connected to the write global bit line and the local bit line.

3. The nonvolatile memory device of claim 2, being formed on a substrate of a first conductivity type, wherein any one of the write local path circuit and the read local path circuit comprises a transistor of a second conductivity type, and the transistor is formed in a pocket well of the first conductivity type.

4. The nonvolatile memory device of claim 2, being formed on a substrate of the first conductivity type, wherein any one of the write local path circuit and the read local path circuit comprises a transistor of the first conductivity type, and the transistor is formed in a well of the second conductivity type.

5. A nonvolatile memory device comprising:
a memory array including a plurality of memory banks which are arranged in a first direction;
a write global bit line and a read global bit line extending in the first direction to be shared by the memory banks;
a write circuit connected to the write global bit line and disposed on a first side of the memory array; and
a read circuit connected to the read global bit line and disposed on a second side of the memory array opposite the first side of the memory array,
wherein each of the memory banks extends in a second direction different from the first direction and comprises a plurality of nonvolatile memory cells, each of the nonvolatile memory cells having a variable resistive element whose resistance value varies according to data stored therein,
wherein the write circuit comprises a first voltage generator configured to generate a first voltage, and a write driver configured to receive the first voltage and to provide a write current through the write global bit line, and
wherein the write circuit is formed on a substrate of the first conductivity type, and a deep well of the second conductivity type is formed under at least part of the write circuit.

6. The nonvolatile memory device of claim 1, wherein the read circuit comprises:
a second voltage generator configured to generate a second voltage; and
a sense amplifier configured to receive the second voltage and to provide a read current through the read global bit line.

7. The nonvolatile memory device of claim 1, wherein any one of the memory banks is configured to perform a write operation while another one of the memory banks performs a read operation.

8. A nonvolatile memory device comprising:
a memory array comprising a plurality of memory banks which are arranged in a first direction;
a write global bit line and a read global bit line extending in the first direction to be shared by the memory banks;
a write circuit connected to the write global bit line; and
a read circuit connected to the read global bit line,
wherein each of the memory banks extends in a second direction different from the first direction and comprises a plurality of nonvolatile memory cells, each of the nonvolatile memory cells having a variable resistive element whose resistance value varies according to data stored therein, and
wherein the write circuit is formed on a substrate of a first conductivity type, and a deep well of a second conductivity type is formed under at least part of the write circuit.

9. The nonvolatile memory device of claim 8, wherein any one of the memory banks is divided into a first memory block and a second memory block, and further comprising:
a local bit line extending in the first direction to be shared by the first memory block and the second memory block; and
a read local path circuit interposed between the first memory block and the second memory block and connected to the read global bit line and the local bit line.

10. The nonvolatile memory device of claim 9, further comprising a write local path circuit located opposite the read local path circuit with respect to the first memory block or the second memory block and connected to the write global bit line and the local bit line.

11. The nonvolatile memory device of claim 8, wherein the write circuit is connected to the write global bit line and is disposed on a first side of the memory array, and the read circuit is connected to the read global bit line and is disposed on a second side of the memory array.

12. A memory system comprising a nonvolatile memory device according to claim 8.

* * * * *